(12) United States Patent
Bultitude et al.

(10) Patent No.: US 11,744,018 B2
(45) Date of Patent: Aug. 29, 2023

(54) COMPONENT ASSEMBLIES AND EMBEDDING FOR HIGH DENSITY ELECTRONICS

(71) Applicant: KEMET Electronics Corporation, Fort Lauderdale, FL (US)

(72) Inventors: John Bultitude, Simpsonville, SC (US); Peter Alexandre Blais, Milpitas, CA (US); James A. Burk, Simpsonville, SC (US); Galen W. Miller, Simpsonville, SC (US); Hunter Hayes, Simpsonville, SC (US); Allen Templeton, Simpsonville, SC (US); Lonnie G. Jones, Simpsonville, SC (US); Mark R. Laps, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 227 days.

(21) Appl. No.: 17/147,908

(22) Filed: Jan. 13, 2021

(65) Prior Publication Data

US 2021/0227693 A1 Jul. 22, 2021

Related U.S. Application Data

(60) Provisional application No. 62/962,340, filed on Jan. 17, 2020.

(51) Int. Cl.
| | |
|---|---|
| *H05K 1/18* | (2006.01) |
| *H01G 4/38* | (2006.01) |
| *H05K 1/14* | (2006.01) |
| *H05K 1/02* | (2006.01) |
| *H05K 3/32* | (2006.01) |

(Continued)

(52) U.S. Cl.
CPC ............... *H05K 1/181* (2013.01); *H01G 4/38* (2013.01); *H05K 1/0272* (2013.01); *H05K 1/145* (2013.01);
(Continued)

(58) Field of Classification Search
CPC .... H05K 1/14; H05K 1/141–147; H05K 1/18; H05K 1/181–187; H01G 4/30;
(Continued)

(56) References Cited

U.S. PATENT DOCUMENTS

| | | | |
|---|---|---|---|
| 4,748,537 A | 5/1988 | Hernandez et al. | |
| 4,800,459 A * | 1/1989 | Takagi | H01L 23/49822 361/321.2 |

(Continued)

OTHER PUBLICATIONS

ISA/US; International Search Report and Written Opinion prepared for PCT/US21/13217; dated Jul. 19, 2021.

*Primary Examiner* — Tuan T Dinh
(74) *Attorney, Agent, or Firm* — Joseph T. Guy; Patent Filing Specialist Inc.

(57) ABSTRACT

Provided is a high-density multi-component package comprising a first module interconnect pad and a second module interconnect pad. At least two electronic components are mounted to and between the first module interconnect pad and the second module interconnect pad wherein a first electronic component is vertically oriented relative to the first module interconnect pad. A second electronic component is vertically oriented relative to the second module interconnect pad.

55 Claims, 12 Drawing Sheets

(51) Int. Cl.
- *H01L 29/20* (2006.01)
- *H01G 4/30* (2006.01)
- *H01L 25/07* (2006.01)
- *H01L 29/16* (2006.01)

(52) U.S. Cl.
CPC ............... H05K 3/328 (2013.01); *H01G 4/30* (2013.01); *H01L 25/072* (2013.01); *H01L 29/1608* (2013.01); *H01L 29/2003* (2013.01); *H05K 2201/10015* (2013.01); *H05K 2201/10166* (2013.01); *H05K 2201/10545* (2013.01)

(58) Field of Classification Search
CPC .. H01G 4/38; H01G 4/012; H01G 4/224–228; H01G 4/232
USPC ........ 361/300–308, 764–767, 782–784, 790, 361/795; 257/685–690
See application file for complete search history.

(56) References Cited

U.S. PATENT DOCUMENTS

| | | | |
|---|---|---|---|
| 5,428,499 A * | 6/1995 | Szerlip | H01G 4/38 361/328 |
| 6,058,004 A * | 5/2000 | Duva | H01G 4/38 361/328 |
| 6,418,029 B1 * | 7/2002 | McKee | H05K 1/145 361/803 |
| 6,841,842 B2 * | 1/2005 | Li | H01L 31/12 257/431 |
| 7,317,622 B2 * | 1/2008 | Li | H05K 1/0231 361/306.3 |
| 7,633,739 B2 * | 12/2009 | Devoe | H01G 4/30 361/308.1 |
| 8,028,397 B2 * | 10/2011 | Bultitude | H05K 3/301 29/830 |
| 8,720,050 B2 | 5/2014 | Chikagawa et al. | |
| 9,875,851 B2 | 1/2018 | Engel et al. | |
| 9,905,363 B2 * | 2/2018 | Engel | H01G 4/232 |
| 10,325,895 B2 | 6/2019 | Nakahara | |
| 11,083,089 B1 * | 8/2021 | Toong | H05K 1/185 |
| 2004/0248330 A1 | 12/2004 | Kitabatake et al. | |
| 2007/0057284 A1 | 3/2007 | Caey et al. | |
| 2008/0174931 A1 | 7/2008 | Skamser et al. | |
| 2013/0146347 A1 | 6/2013 | McConnell et al. | |
| 2017/0025223 A1 * | 1/2017 | Bultitude | B23K 1/008 |
| 2018/0324950 A1 * | 11/2018 | Nomura | H05K 1/145 |
| 2018/0332708 A1 * | 11/2018 | Lambert | H01L 23/49827 |
| 2019/0080982 A1 | 3/2019 | Bultitude et al. | |
| 2019/0215950 A1 | 7/2019 | Bauer-Öppinger et al. | |

\* cited by examiner

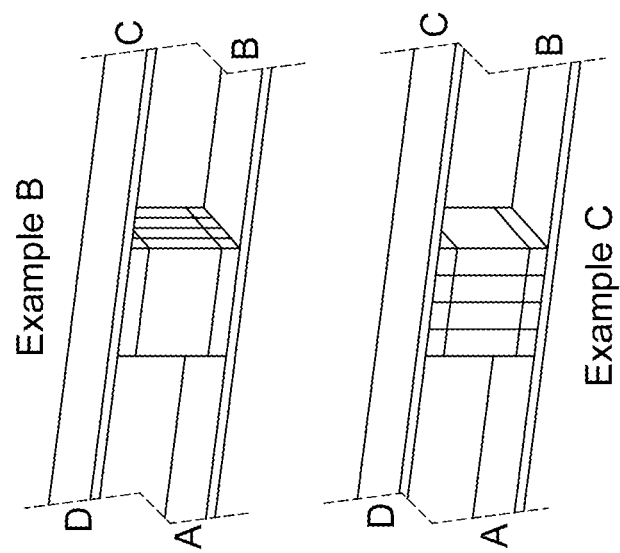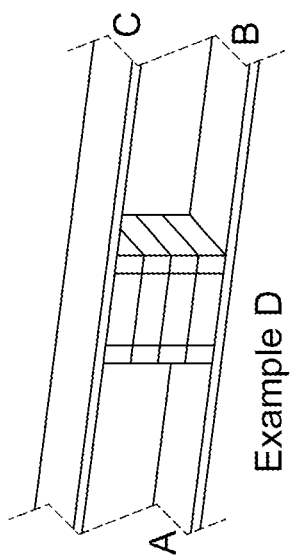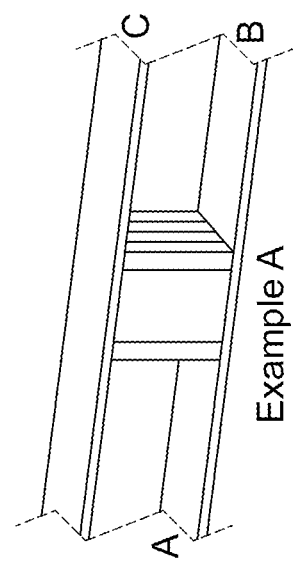
Fig. 11

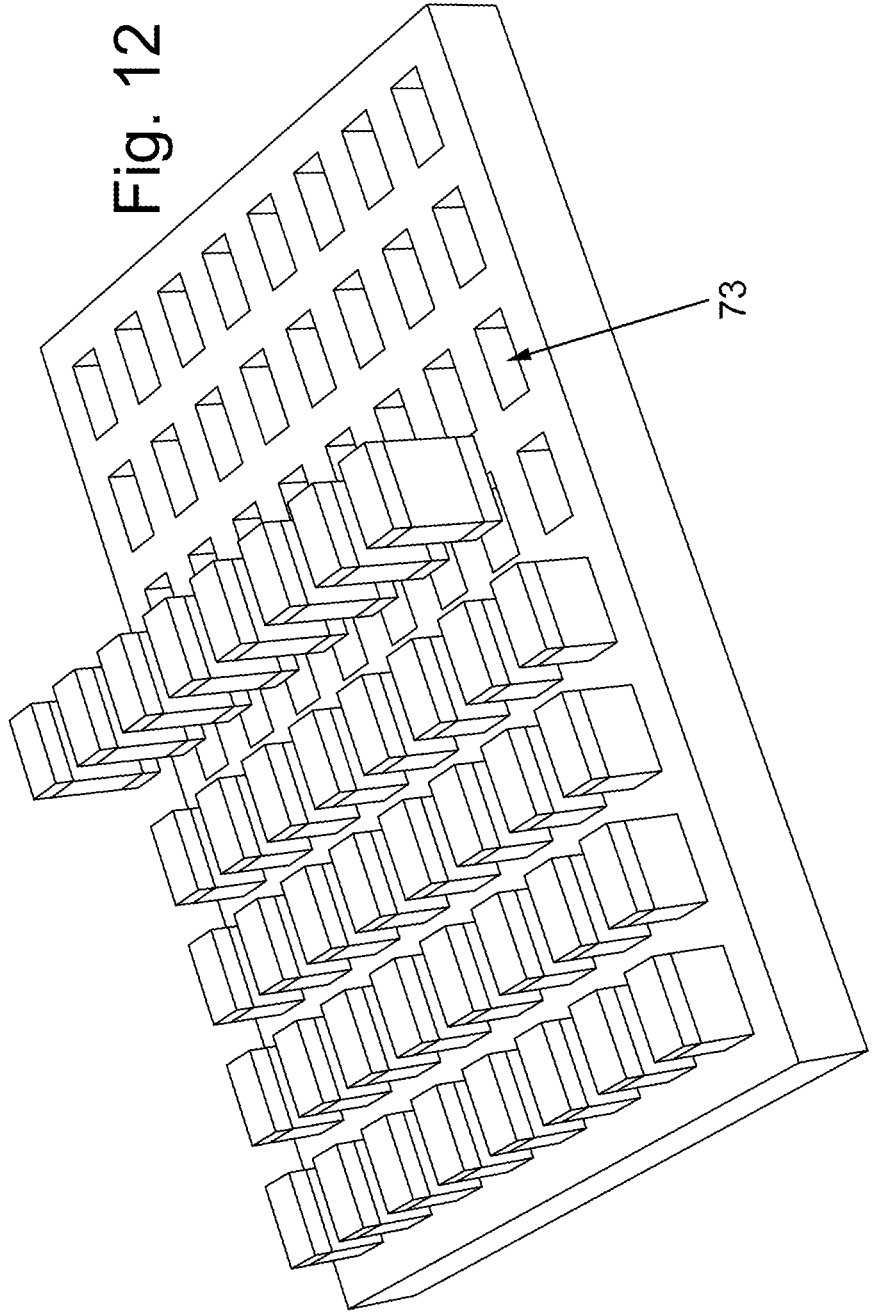

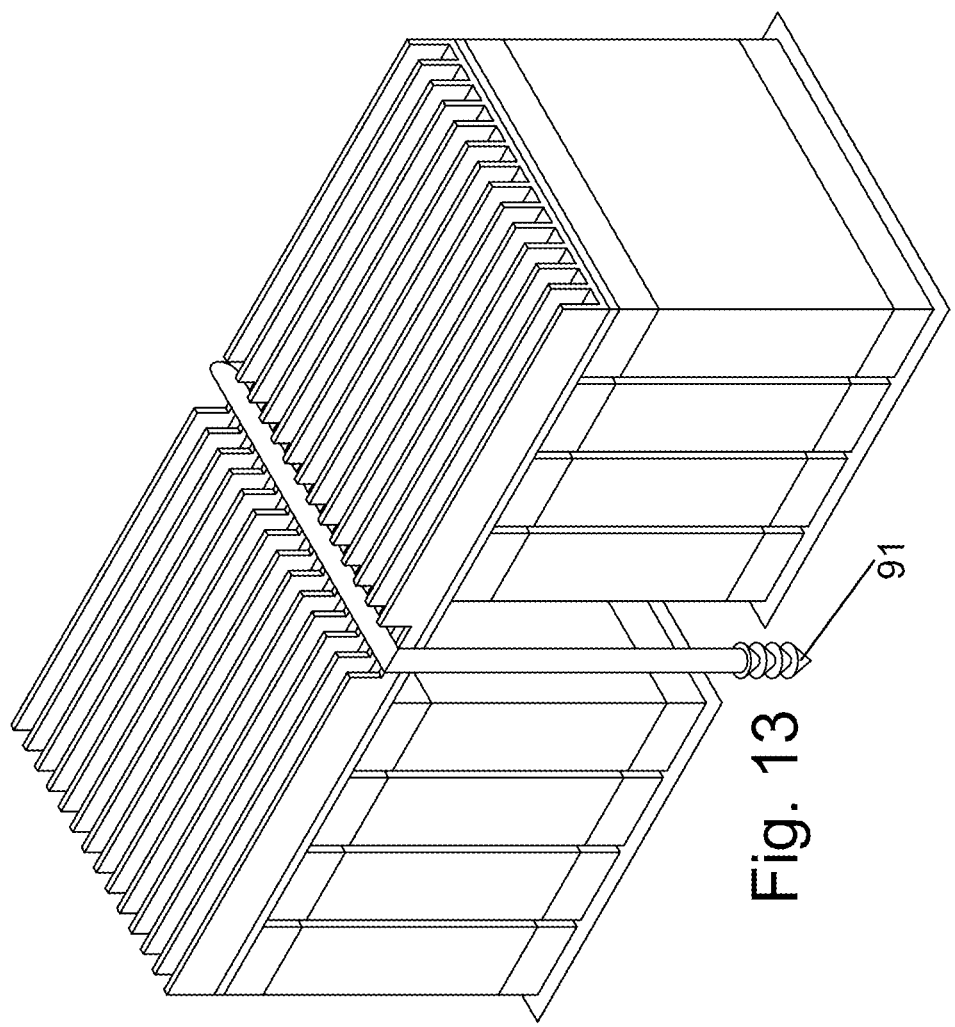

COMPONENT ASSEMBLIES AND EMBEDDING FOR HIGH DENSITY ELECTRONICS

CROSS-REFERENCE TO RELATED APPLICATIONS

The present invention claims priority to U.S. Provisional Application No. 62/962,340 filed Jan. 17, 2020 which is incorporated herein by reference.

FIELD OF THE INVENTION

The present invention is related to improved assemblies for electronic components. More specifically, the present invention is related to embedded electronic components which allows for a high density of electronic components and which is particularly suitable for high power electronics as achieved with wide band-gap semiconductor materials such as SiC and GaN.

BACKGROUND

There is an on-going need for improved component assemblies, particularly, for use with high-power electronics such as those emerging from the use of wide band gap semiconductor materials such as SiC, or GaN instead of silicon. These wide band gap semiconductors operate at much higher power, at higher frequency, to achieve higher efficiency power conversion that allows for further miniaturization of circuitry. Unfortunately, the heat generated is difficult to mitigate using conventional techniques.

Multilayer Ceramic Capacitors (MLCC) are being used increasingly in high power applications where they are exposed to high amounts of AC voltage. The resulting ripple current produced in the capacitors causes them to heat-up. Power dissipated (P) is defined by the equation $P=I^2R$ where I is current and R is the equivalent series resistance (ESR). Capacitors draw more AC current as frequency increases so $I^2$ increases more than ESR decreases. Since wide band gap semiconductors are operated at higher frequencies than silicon this becomes an important consideration.

In an MLCC heat is dissipated at the surface of the capacitor at either the ceramic surface or through the external terminations. It is generally recognized that self-heating of about 20-25° C., at the surface, is a safe condition for these types of capacitors but any additional heating can result in thermal runaway and failure of the MLCC. The internal metal electrodes are effective heat conductors whereas the ceramic dielectrics are typically very good thermal insulators. Increasing the number of internal electrodes in contact with the external terminations can therefore reduce ESR and self-heating. This is also desirable with respect to increasing the capacitance. Capacitance (C) is defined by the equation $C=\varepsilon_r\varepsilon_0 An/t$; where $\varepsilon_r$ is the relative permittivity of the dielectric; $\varepsilon_0$ is a constant equal to the permittivity of free space; A is the overlap area for each internal conductive layer, also referred to as an active; n is the number of actives and t is the separation distance or thickness between the electrodes. Therefore, it is an ongoing desire to increase the number of layers and overlap area while decreasing the layer separation. However, in a given MLCC reducing the active thickness of the ceramic to increase capacitance reduces the voltage handling capability of the MLCC. For this reason, it has become necessary to package these capacitors in large assemblies that require large circuit board areas. Large assemblies are contrary to the ongoing desire to miniaturize electronics and therefore there is increased interest in embedding MLCC's in circuits or in providing modules with multiple MLCC's that provide a high-density package that can be integrated into a heterogeneous packages.

U.S. Pat. No. 8,331,078 teaches MLCC's arranged in non-ferrous lead frames wherein the base internal electrodes of the capacitors and the edge surfaces of the external termination are perpendicular to the mounting substrate. This arrangement confers low ESR and low ESL to the resulting assembly. U.S. Pat. No. 9,875,851 teaches an optimized MLCC structure wherein the internal electrodes are arranged perpendicular to the plane of assembly to confer a low ESR of 3 to 5 mΩ in a frequency range from kHz to MHz. U.S. Pat. No. 9,905,363 teaches capacitors based on antiferroelectric ceramic dielectric arranged on lead frames and incorporated within a module package.

More recently, U.S. Pat. No. 10,325,895 described a semiconductor module with circuit elements, such as capacitors and resistors, bonded between a plurality of metal plates bonded to at least one switching element. These two terminal circuit elements are bonded in an orientation vertical to the length of the module. The circuit elements are orientated vertically between metal plates of a semiconductor module wherein multiple MLCC's are utilized to illustrate the benefits of vertical orientation.

In these prior art teachings, the circuit elements must be incorporated into the power electronics module as a separate component. In the case of the leaded capacitors these require customized assembly which is inefficient from a cost and productivity perspective. Conventional surface mount assembly techniques are readily available, but the subsequent module has relatively low package density.

Embedding smaller MLCC's is gaining in popularity and some examples are described in U.S. Pat. No. 8,720,050.

The prior art examples of embedded capacitors require via connections to the embedded components. More recently components have been embedded in polymer printed circuit boards such as described in U.S. Pat. No. 9,386,702 where vias are used to connect the embedded components.

In prior art embodiments, MLCC's can be embedded by placing their inner electrodes parallel to the plane of the circuit board. In the subsequent layering process cavities are formed around the parts and the circuit interconnections are then formed through vias to their terminals. In current practice copper vias are formed to the terminals through FR4 circuit materials. U.S Published Patent Application US2019/0215950 describes multiple-diameter laser filled bores to address some of the limitations of embedding components in circuits in this way. As larger numbers of smaller components are embedded in circuits it becomes difficult to register the laser bores for vias and forming the vias is very time consuming as is the subsequent copper plating of the vias. This process also requires the components to have compatible terminations that are typically copper for MLCC. Copper terminations are prone to oxidation if stored for extended times prior to assembly and have limited compliancy.

In spite of the advances the art still lacks adequate component assemblies which are suitable for use in high power applications such as provided by the use of SiC wide band-gap materials. Provided herein are improved component assemblies and particularly high-density electronics utilizing embedded components, particularly MLCC's.

SUMMARY OF THE INVENTION

The present invention is related to improved component assemblies.

More specifically, the present invention is related to improved component assemblies which are particularly suitable for use with high power applications such as available with SiC and GaN based wide band-gap semiconductor devices.

A particular feature of the present invention is the ability to incorporate cooling components.

These and other embodiments, as will be realized, are provided in a high-density multi-component package comprising a first module interconnect pad and a second module interconnect pad. At least two electronic components are mounted to and between the first module interconnect pad and the second module interconnect pad wherein a first electronic component is vertically oriented relative to the first module interconnect pad. A second electronic component is vertically oriented relative to the second module interconnect pad.

Yet another embodiment is provided in a high-density multi-component package comprising a first electronic component and a second electronic component. The first electronic component and second electronic component each comprise a first external termination and a second external termination wherein each first external termination and each second external termination comprises an edge surface and side surfaces. The package also comprises a wide band-gap semiconductor device comprising a first interconnect pad and a second interconnect pad wherein the first interconnect pad is electrically connected to the edge surface of the first external termination and the second interconnect pad is electrically connected to the edge surface of the second electronic component.

Yet another embodiment is provided in a method for forming a high-density multi-component package. The method includes:
 providing a wide band-gap semiconductor device comprising a first interconnect pad and a second interconnect pad;
 providing a substrate;
 providing at least two electronic components; and
 mounting the two electronic components between the substrate and wide band-gap semiconductor device wherein the two electronic components are vertically oriented.

BRIEF DESCRIPTION OF DRAWINGS

FIG. 11 illustrates the current flow utilized for demonstration of the invention.

FIG. 12 illustrates a base with recess areas.

FIG. 13 illustrates an electrically insulating restraint.

DESCRIPTION

The present invention is related to improved component assemblies which are particularly suitable for use in high power applications, such as those afforded by wide band-gap materials such as SiC and GaN. More specifically, the present invention is related to embedded components, particularly MLCC's, which allow for reduced parasitics and reduced failure in high power applications.

It is an objective of the present invention to provide a high-density package using common surface mount assembly techniques to form an array of components, particularly but not limited to MLCC's, for subsequent integration in a power module or laminated circuit board. The electrical and thermal performance of this high density package can be optimized by the techniques described herein and multiple components can be readily incorporated within the package. A particular advantage, relative to the prior art, is a minimization or elimination of the necessity of through vias for electrical conductivity thereby simplifying production.

The invention will be described with reference to the figures forming an integral, non-limiting, component of the disclosure. Throughout the various figures similar elements will be numbered accordingly.

The present invention provides module solutions and embedded packages whereby the components, preferably including MLCC's, are assembled in the Z-direction with the internal electrodes perpendicular to the plane of the circuit board or module and the edge surface of the external terminations in direct electrical contact with metal terminations on the circuit board or module. Although this is not the direction of typical surface mounted assemblies this provides several key advantages over the prior art.

In an embodiment of the invention, heat is removed primarily through the external terminations which are directly contacted through interconnects. This allows the external terminations to function as both an electrical and thermal dissipation interface.

In an embodiment of the invention, cooling channels and elements can be readily incorporated into the package thereby allowing for the dissipation of heat from the components by passive or active means. Alternatively, thermally conducting materials can be readily incorporated in the package to facilitate dissipation of heat away from the package. Cooling channels are particularly suitable for use in multilayer ceramic capacitor structures for use at high power are described in U.S. Pat. No. 10,147,544.

Embedding the components, preferable MLCC's, minimizes or eliminates reliance on through vias to form interconnections with the components thereby increasing productivity.

The embedded components, particularly MLCC's, allows the components to be arranged in a way that reduces electrical series inductance and electrical series resistance and allows the integration of a multiplicity of components such as sensor, resistors and inductors which are integrated within the package.

Figure 1:
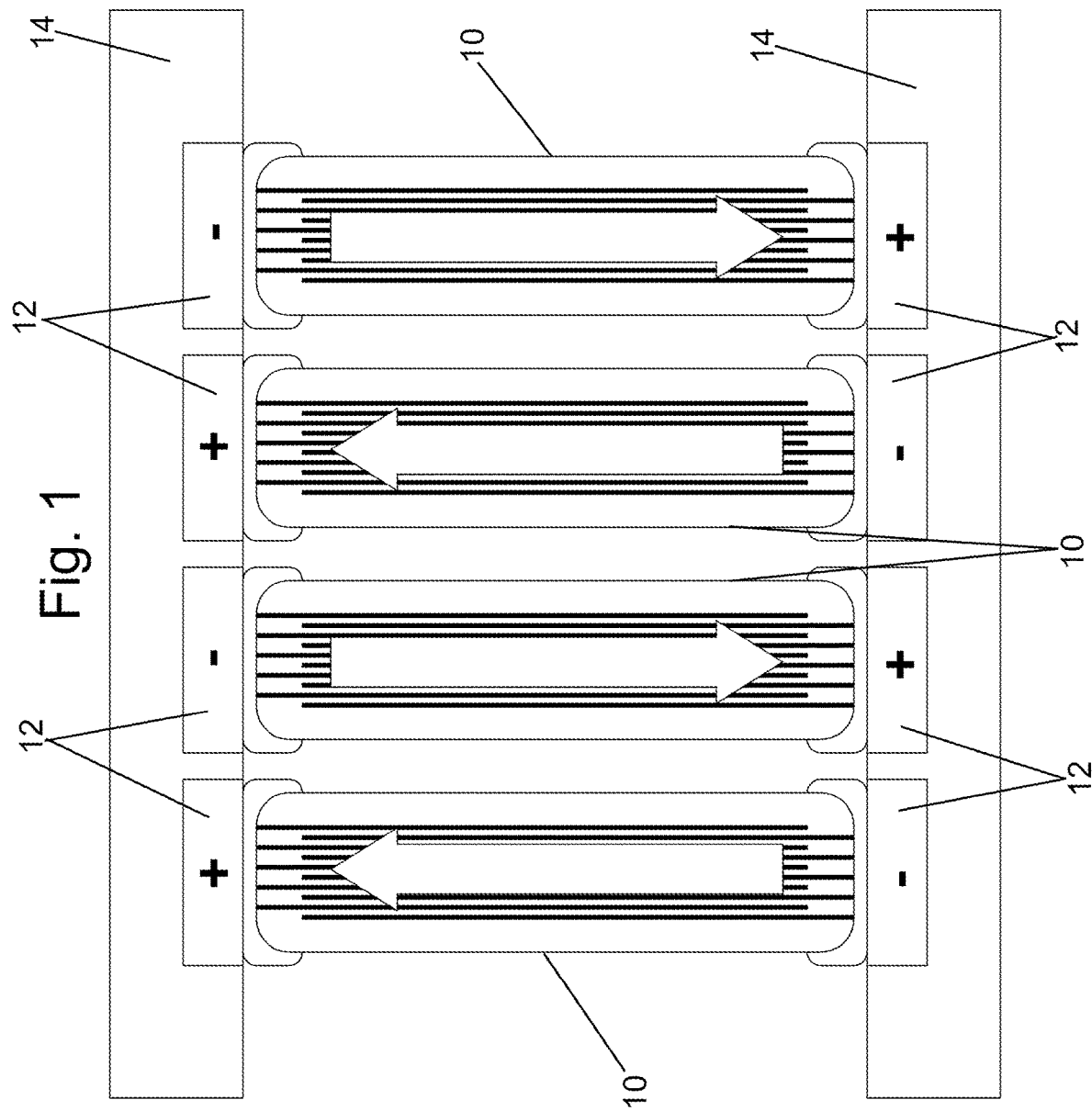
FIG. 1 is a schematic cross-sectional representation of a package with standard MLCC's, representing electronic components, arranged for inductive cancellation.

In an embodiment of the invention electronic components, particularly MLCC's, are arrangement to confer a low Equivalent Series Inductance (ESI) as illustrated in FIG. 1. The alternating polarity provides for a decrease in the size of the inductive loop. The minimized electrical path length, achieved by decreasing the distance between the MLCC and metals used in interconnections also allows for a low ESR. Packaging within a substrate allows for an even lower ESI particularly when there are multiple rows of MLCC's arranged with opposing polarities.

In FIG. 1, components, 10, such as MLCC's, are alternately mounted to mounting pads, 12, wherein adjacent pads on substrates, 14, are of opposite polarity. The charge therefore flows in opposite directions, as indicated by the arrows, for adjacent components thereby providing inductive cancellation.

Low inductances are beneficial because higher switching current edge rates and higher switching frequencies in Wide Band-Gap semiconductor applications, particularly SiC based semiconductors, create greater voltage ringing which drives inductive loads. Snubber capacitors placed close to a switch package helps to reduce this ringing. Integrating the snubber in the substrate further reduces the total loop inductance from the snubber to the switching device maximizing the benefit of the snubbers. To achieve zero-voltage switching (ZVS) it is desirable to incorporate snubber capacitors as close to the switches as possible and for a given circuit it may also be desirable to incorporate a resistor in this assembly to mitigate the aforementioned ringing.

An important aspect of the current invention is the ability to enable larger DC link capacitor assemblies to be integrated with semiconductors. A DC-Link is shown schematically in the circuit diagram of FIG. 2. Larger capacitance, DC-Links can be achieved without the necessity of long, continuous metal leads thereby also decreasing the problems associated with coefficient of thermal expansion (CTE) mismatches which occur with conventional assemblies.

Figure 2:
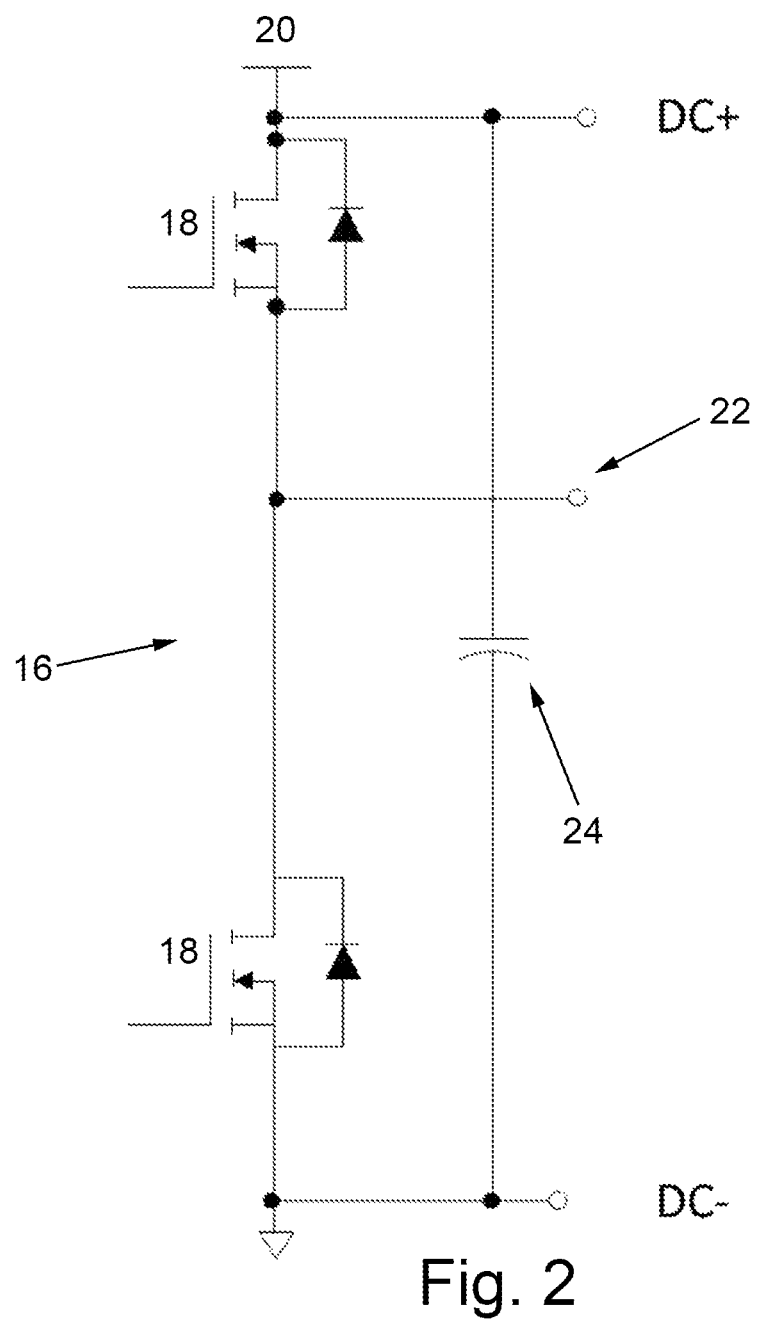
FIG. 2 is an electrical schematic diagram of a DC link capacitor.

In FIG. 2 the schematic diagram, 16, illustrates a pair of switches, 18, for a high voltage DC link, 20, comprising an inverter output, 22, and a DC link capacitor, 24, as would be realized by those of skill in the art.

Figure 3:
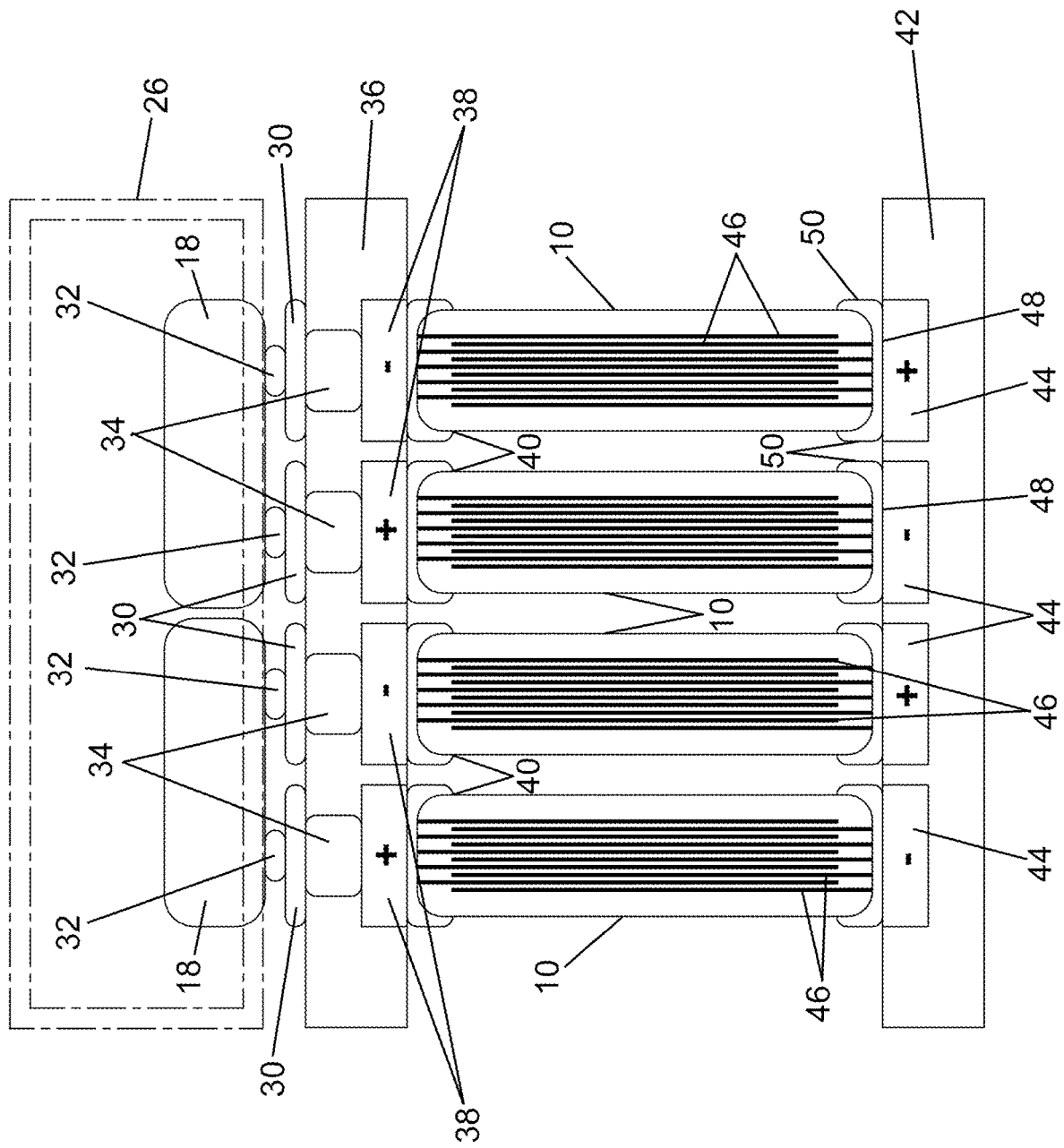
FIG. 3 is a schematic representation of integrated assembled capacitors.

An embodiment of the invention will be described with reference to FIG. 3. In FIG. 3 components, 10, represented as capacitors without limit thereto, are integrated with switches, 18, preferably within a multi-switch module area, 26. The switches are mounted to module interconnect pads, 30, by a conductive adhesive, 32, preferably a Transient Liquid Phase Sintering (TLPS) adhesive. Optional vias, 34, through an optional substrate, 36, provide electrical connectivity to component terminations, 38, wherein adjacent component terminations are of opposite polarity. The first external terminations, 40, of the components, 10, are in direct electrical contact with the component terminations by a conductive adhesive and preferably a TLPS. A circuit board, 42, comprising terminations, 44, provides connectivity to additional electrical functionality. In a particularly preferred embodiment, the components are MLCC's comprising internal electrodes, 46, wherein adjacent internal electrodes are of opposite polarity as well known in the art. The internal electrodes are perpendicular to the module interconnect pad and the lone edge surface, 48, of the external termination is parallel to the module interconnect pad and the multiple side surfaces, 50, of the external termination are all perpendicular to the interconnect pad which is referred to herein as vertically oriented. Vertically oriented is distinguished from horizontally oriented. In horizontally oriented components at least one of the side surfaces, 50, and typically two side surfaces of the external termination are parallel to the module interconnect pad. In horizontally oriented components the internal electrodes can be parallel to the module interconnect pad, which is referred to as standard orientation. Alternatively, in vertically oriented components the internal electrodes can be perpendicular to the module interconnect pad with the edge surface perpendicular to the module interconnect pad.

As illustrated in FIG. 3, a particular feature is the ability to form an array of components, particularly MLCC's without lead frames. Providing a stack of components without lead frames reduces material cost, improves manufacturing efficiency and reduces internal parasitic effects such as resistance.

In a particularly preferred embodiment, the module interconnect pads are in direct physical contact with the edge surface of the external termination of the component thereby eliminating the substrate and via. Direct physical contact is defined herein as a contact with only a conductive adhesive between the elements in direct physical contact such as would be realized with a module interconnect pad in direct physical contact with the MLCC termination by a conductive adhesive such as a solder, high temperature conductive adhesive or transient liquid phase sintering (TLPS) conductive adhesive.

TLPS adhesives are mixtures of two or more metals or metal alloys prior to exposure to elevated temperatures thereby distinguishing the thermal history of the material. TLPS adhesives exhibit a low melting point prior to exposure to elevated temperatures, and a higher melting point following exposure to these temperatures. The initial melting point is the result of the low temperature metal or an alloy of two low temperature metals. The second melting temperature is that of the intermetallic formed when the low temperature metal or alloy, forms a new alloy with a high temperature melting point metal thereby creating an intermetallic having a higher melting point. TLPS adhesives form a metallurgical bond between the metal surfaces to be joined. Unlike tin/lead or lead (Pb) free solders, the TLPS do not spread as they form the intermetallic joint. Rework of the TLPS system is very difficult due to the high secondary reflow temperatures. Transient Liquid Phase Sintering is the terminology given to a process to describe the resulting metallurgical condition when two or more TLPS compatible materials are brought in contact with one another and raised to a temperature sufficient to melt the low temperature metal. To create a TLPS process or interconnect, at least one of those metals being from a family of metals having a low melting point such as tin (Sn), Indium (In) and the second coming from a family having high melting points such as Copper (Cu) or Silver (Ag). When Sn and Cu are brought together, and the temperature elevated the Sn and Cu form Cu/Sn intermetallics and the resulting melting point is higher than the melting point of the metal having a low melting point. In the case of In and Ag, when sufficient heat is applied to the In to cause it to melt it actually diffuses into the Ag creating a solid solution which in turn has a higher melting point than the In itself. TLPS will be used to generically reference the process and the TLPS compatible materials used to create a metallurgical bond between two or more TLPS compatible metals. TLPS provides an electrical and mechanical interconnect that can be formed at a relatively low temperature (<300° C.) and having a secondary re-melt temperature >600° C. These temperatures are determined by the different combination of TLPS compatible metals. TLPS will be used to generically pertain to the process and materials used to create a TLPS metallurgical bond or interconnect.

It will be realized by those skilled in the art that components, particularly MLCC's, can be incorporated in these packages to perform a multitude of functionalities. By way of example, by combining multiple capacitors within the package and contacting them to the same pad larger DC-Link capacitances can be realized. Arrays of pre-assembled capacitors may be incorporated in this way or by placement of individual components. In FIG. 3 the package is connected to the module but using the same packaging techniques a high-density capacitor package can be produced as shown in FIG. 4.

Figure 4:
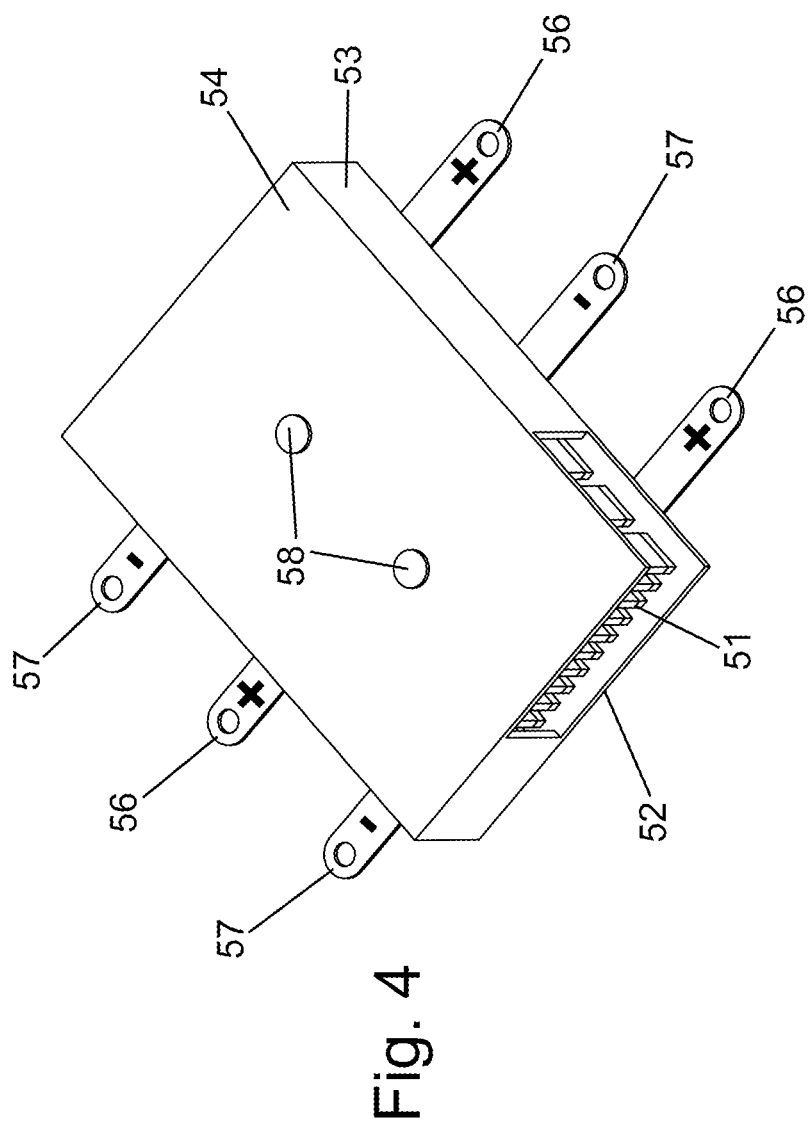
FIG. 4 is a schematic representation of a high-density capacitor package.

In FIG. 4, an array of vertically oriented components, 51, preferably at least some of which are MLCC's, are sandwiched within a package comprising a base, 52, and a top, 54, wherein it is preferred that the base and top provide an enclosure with sides, 53. The edge surface of the external termination of adjacent components are electrically connected to a positive connector tab, 56, and the opposite edge surface of the external termination of adjacent connectors are electrically connected to a negative connector tab, 57, wherein positive and negative are arbitrarily assigned for the purposes of discussion. Assuming all components are MLCC's, for the purpose of discussion, a large number of capacitive couples, each with any number of MLCC's, can be envisioned from the illustration with three separate capacitive couples illustrated without limit thereto. Alternatively, components other than MLCC's can be utilized within the enclosure to achieve various electrical functionalities. Optional insulated screws, 58, such as a Teflon® screw, can be utilized to add mechanical restraint to the package or for attachment of the package to a substrate. Flexible terminations can be used for forming electrical attachment to the components and compliant terminations can be utilized for the connector tabs.

Figure 5:
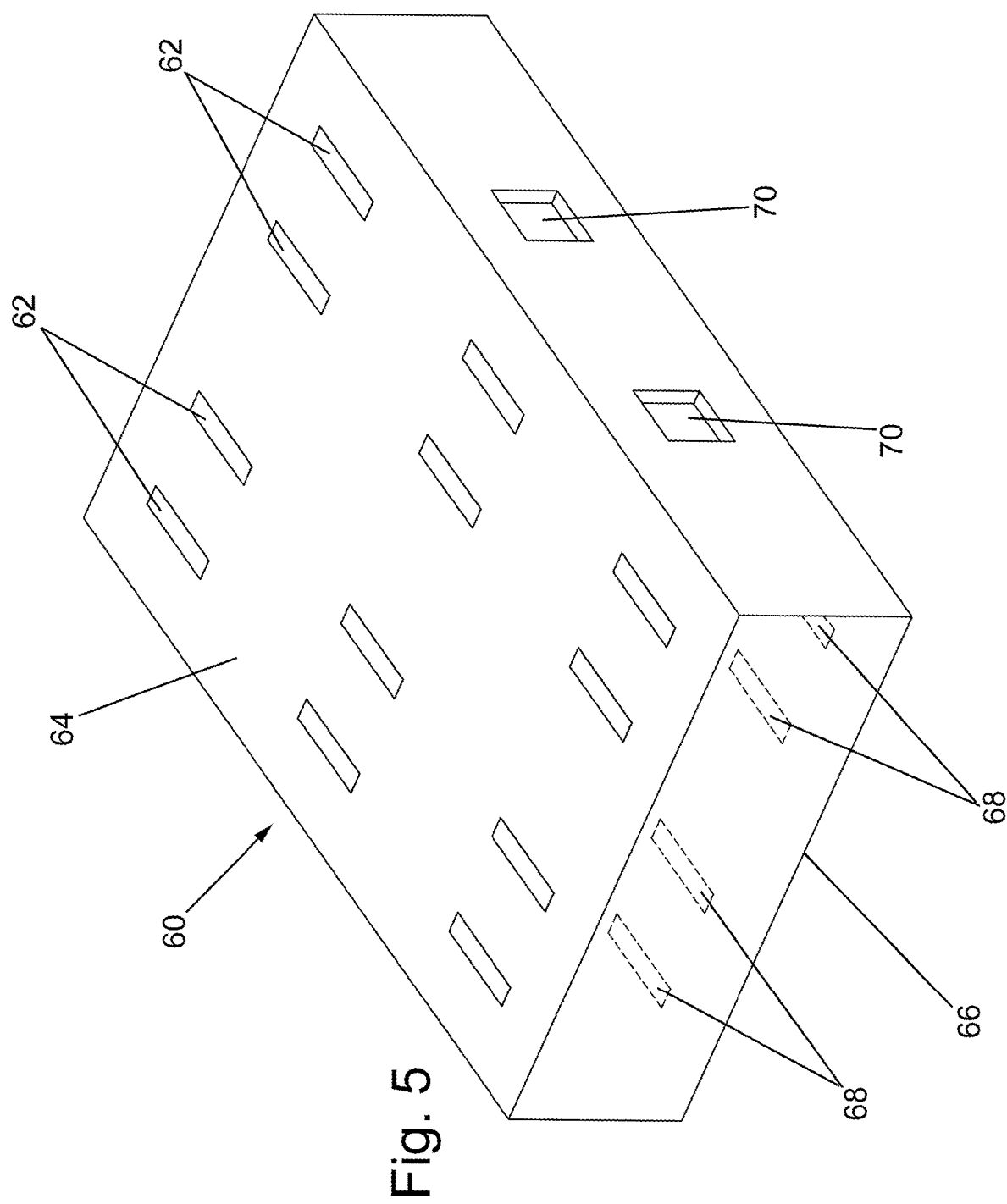
FIG. 5 is a schematic representation of a high-density package incorporating cooling elements and other components.

An embodiment of a package, 60, is illustrated in schematic view in FIG. 5 without components for clarity. In FIG. 5 modular interconnect pads, 62, are illustrated on the top, 64, of the package to afford the contacts to integrate with a module wherein the arrangement of modular interconnect pads are a design choice and not particularly limited by the figures or otherwise herein. The base, 66, also has terminations, 68, wherein the terminations in the base preferably match the position of the modular interconnect pads as would be realized from the teachings herein. A particular advantage is the ability to incorporate auxiliary circuitry on surfaces within the interior, the exterior, or any of the sides of the package thereby increasing functionality of the package. In a preferred embodiment the package comprises cooling channels, 70, which allow a cooling medium to pass into and preferably through the package for heat dissipation or mediation from the interior of the package. The cooling medium preferably flows, without limit thereto, wherein the flow of the cooling medium may be convection flow or forced flow. For the purposes of the instant invention forced flow is defined as a flow which is enhanced, such as by a fan or pump, without limit to the type of fan or pump. Convection, or convective, flow is defined as flow which is not enhanced but instead flows due to thermal gradients.

With large arrays of components, particularly MLCC's, dissipating heat improves the longevity and functionality of the package. In an MLCC heat is dissipated primarily by thermal conduction from the inner electrodes through the external terminations of the capacitors. Although it is important to minimize the ESR in very high-power applications it is necessary to cool the MLCC to keep them within their reliable operational temperature range. This arrangement of components, particularly MLCC's, allows cooling channels to be readily incorporated within the package during assembly. These channels may contain a passive cooling element to dissipate heat or be actively cooled. When combined with the power module as shown in FIG. 3. It may be desirable to form a combination package capable of cooling both the components and module.

Figure 6:
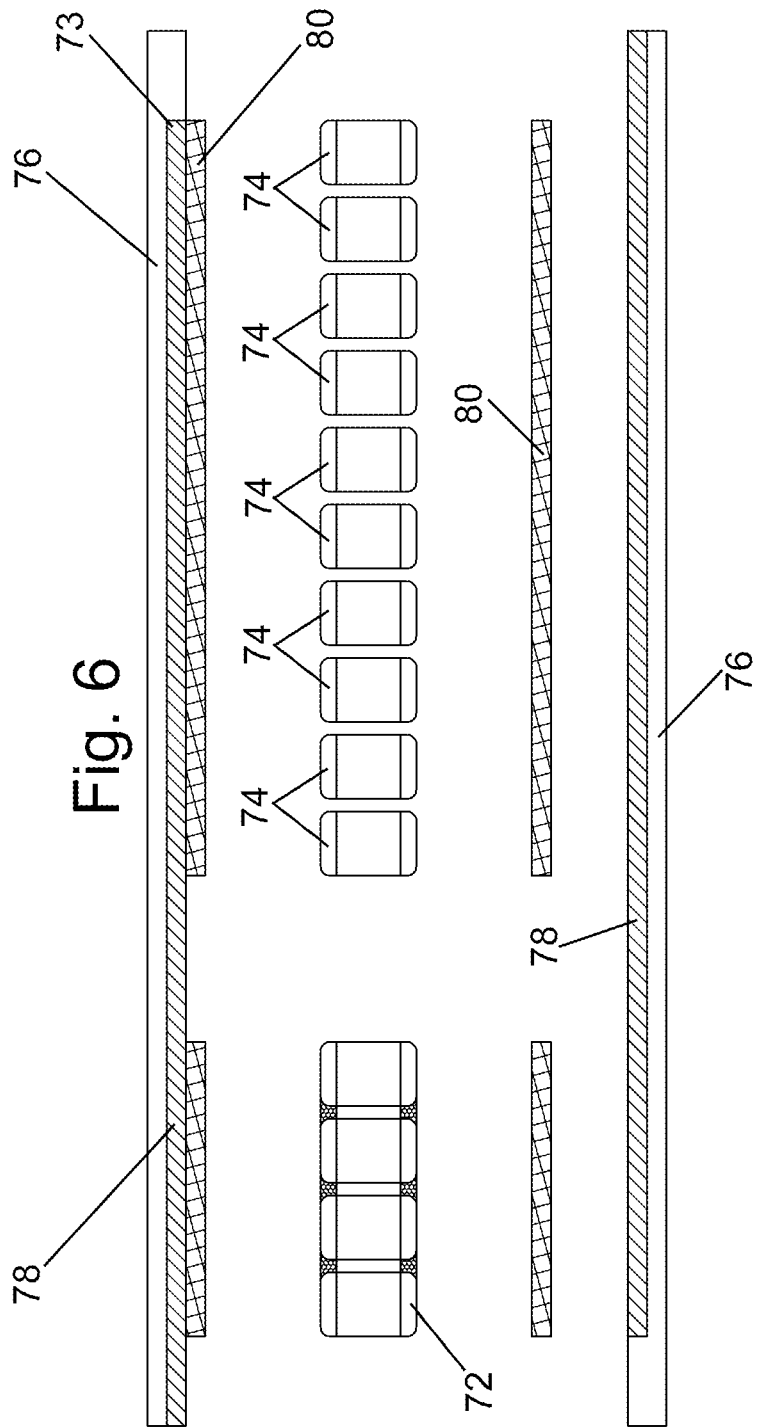
FIG. 6 is a schematic exploded view illustrating component assembly.

The assembly stages of a representative package are shown in FIG. 6. In FIG. 6, a basic assembly is illustrated schematically in exploded view and the method of assembly will be described relative thereto. The components may be a pre-assembled stack, 72, to facilitate ease of placement. Alternatively, individual components, 74, may be assembled. In the case of individual components wherein the length, measured from edge surface to edge surface, is much larger than the width, measured as the largest dimension perpendicular to the length, it is preferred to use recessed areas, 73, within the base to achieve stability as illustrated schematically in FIG. 12. To facilitate rapid placement components may require packaging in the z-direction, defined as perpendicular to the substrates, so placement is done on the termination. Electrically insulated restraints, 91, can be employed as illustrated in FIG. 13.

Electrical contacts extending through the base and top are not shown in FIG. 6 nor is the incorporation of cooling channels. As illustrated in FIG. 6, a base, 76, is provided with conductor traces, 78, formed thereon in accordance with standard practice. An interconnect, 80, is formed by any method known in the art such as printing or dispensing techniques. This include methods such as screen printing, gravure printing, pad printing and pressure dispensing, auger dispensing and ink jet printing. The pre-assembled stack, 72, or individual components, 74, are placed into proper position in accordance with standard procedures in the art. A sandwich is then formed between two bases or substrates to form the package.

It is highly preferred that the interconnects formed during the formation of the package do not flow during the process to bond all the elements of the package together. For this reason, sintered material interconnects such as transient liquid phase sintering or nano-metal pastes are preferred as the High Temperature Conductive Adhesive (HTCA) for the electrical connections to the components. More specifically copper containing interconnects are preferred since these can form a transient phase with tin, the most common component termination finish.

The instant invention is also advantageous for forming embedded components and particularly embedded MLCC's. In this invention the requirement for copper vias is removed since the component terminals are readily connected to the circuit using the previous high temperature interconnects described. In order to form an enclosed cavity using the same bonding process a High Temperature Insulating Adhesive (HTIA) can be employed and to reduce the time required an HTIA that can be cured at the same time is preferred.

Figure 7:
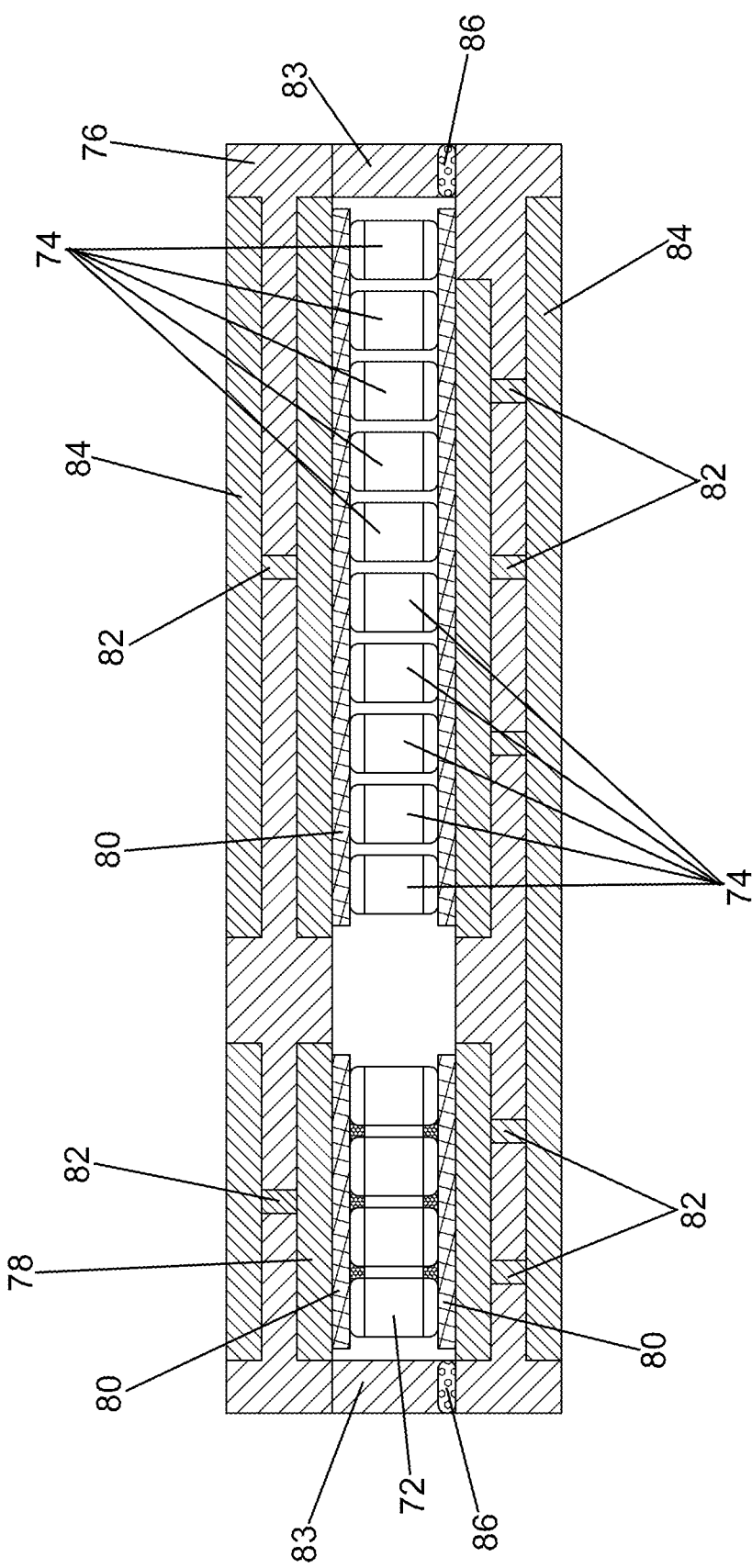
FIG. 7 is a schematic diagram of an enclosed component package.

An embodiment of an embedded component is illustrated schematically in FIG. 7. The enclosed component package shown in FIG. 7 could be a stand-alone component or part of a circuit with embedded components. Using this invention, the laser drilling and connection through copper vias that is common practice for embedded components is avoided and this confers some important advantages with respect to selecting the component terminations for improved reliability as detailed further herein.

In FIG. 7, pre-assembled stack, 72, or individual components, 74, are shown sandwiched between bases, 76, comprising conductor traces, 78, and interconnects, 80. Pre-formed vias, 82, provide conductivity to surface traces, 84, for subsequent electrical connectivity to the balance of a circuit. High temperature insulating adhesives, 86, are preferably employed to secure structural components of the package, such as intermediate layers, 83, which form an electrically isolating portion, to each other as would be realized to those of skill in the art. A particular advantage is realized in the ability to form the base comprising the appropriate traces and vias prior to assembly. This is a significant advantage over the art wherein vias are formed after embedding of the components.

Figure 8:
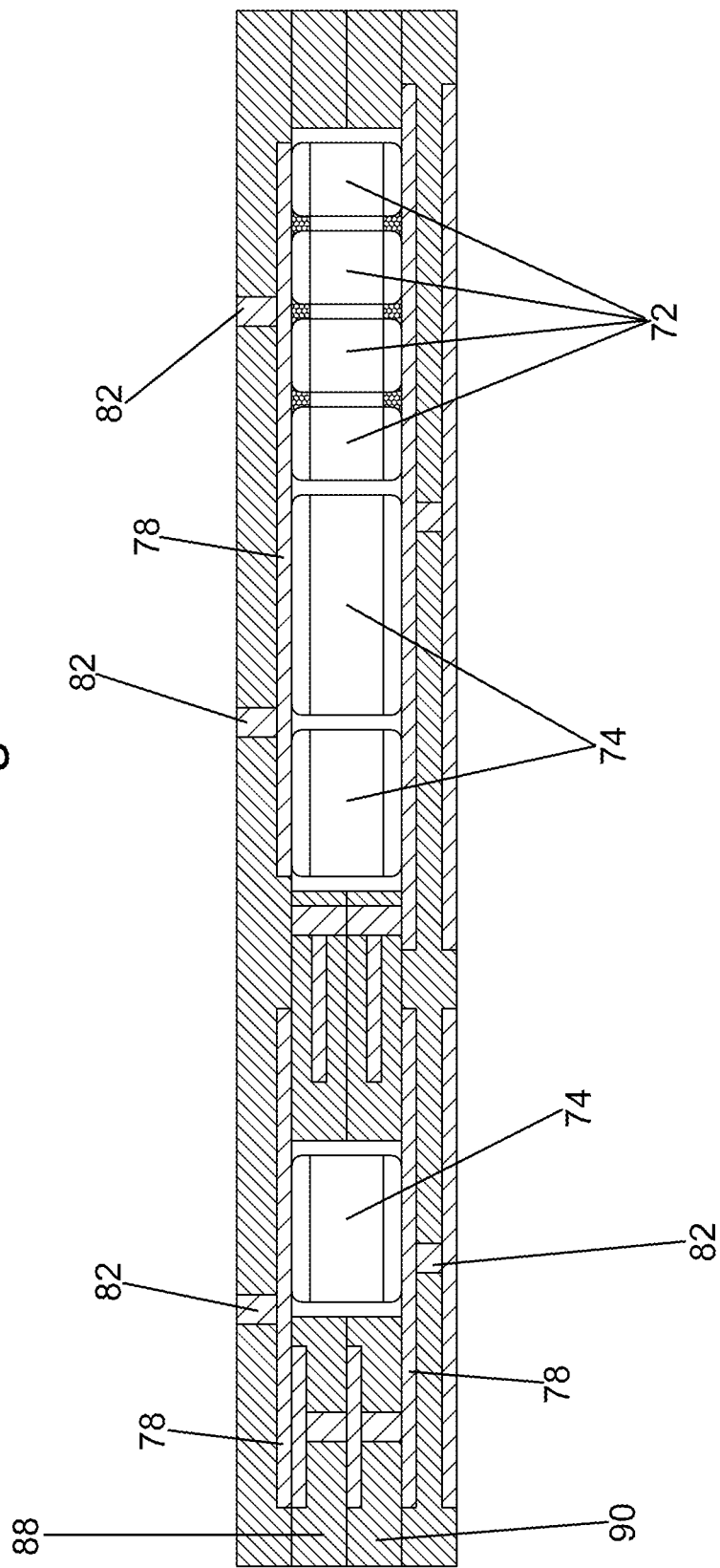
FIG. 8 is a schematic diagram of an embedded circuit board showing components connected through multiple layers.

The electronic component can connect through multiple layers of circuit board as illustrated schematically in FIG. 8. In FIG. 8, circuit boards, 88 and 90, are illustrated as laminated layers forming electrically insulating portion between the bases, 76, wherein various functionality can be provided.

Sintered material interconnects such as transient liquid phase sintering or nano-metal pastes, preferred as the High Temperature Conductive Adhesive (HTCA), and the High Temperature Insulating Adhesives (HTIA) can also be used to form external electrical and non-electrical connections respectively. This can be used to combine the component assemblies to power modules.

The thermal benefits of inventive packing have been detailed but it is also important that components, such as MLCC's, retain their mechanical reliability through temperature and power cycling. The coefficient of thermal expansion mismatches within the package is of critical consideration in this respect. To facilitate robustness, it is therefore important to retain compliancy within the package. The transient liquid phase and nano-metal interconnects of choice are not as compliant as traditional solders or conductive adhesives that use a dispersion of metal in a polymeric matrix. To achieve a more compliant joint it is preferred that the components contain a compliant flexible termination. Flexible terminations can be manufactured using metal particles dispersed in a polymeric organic material. For stand-alone modules a mechanical fastening may also be applied. Furthermore, placing the components in this z-direction orientation minimizes the coefficient of thermal expansion in the longer x-y length orientation since the component length is less than its width thus reducing the length of the CTE mismatch and the resulting stress during temperature cycling.

In the case of larger components, it is desirable to form multiple interconnects to minimize the continuous interconnect length. Concerns with maintaining interconnect contacts through thermal and power cycling can be mitigated by applying a compressive force to the package.

Figure 9:
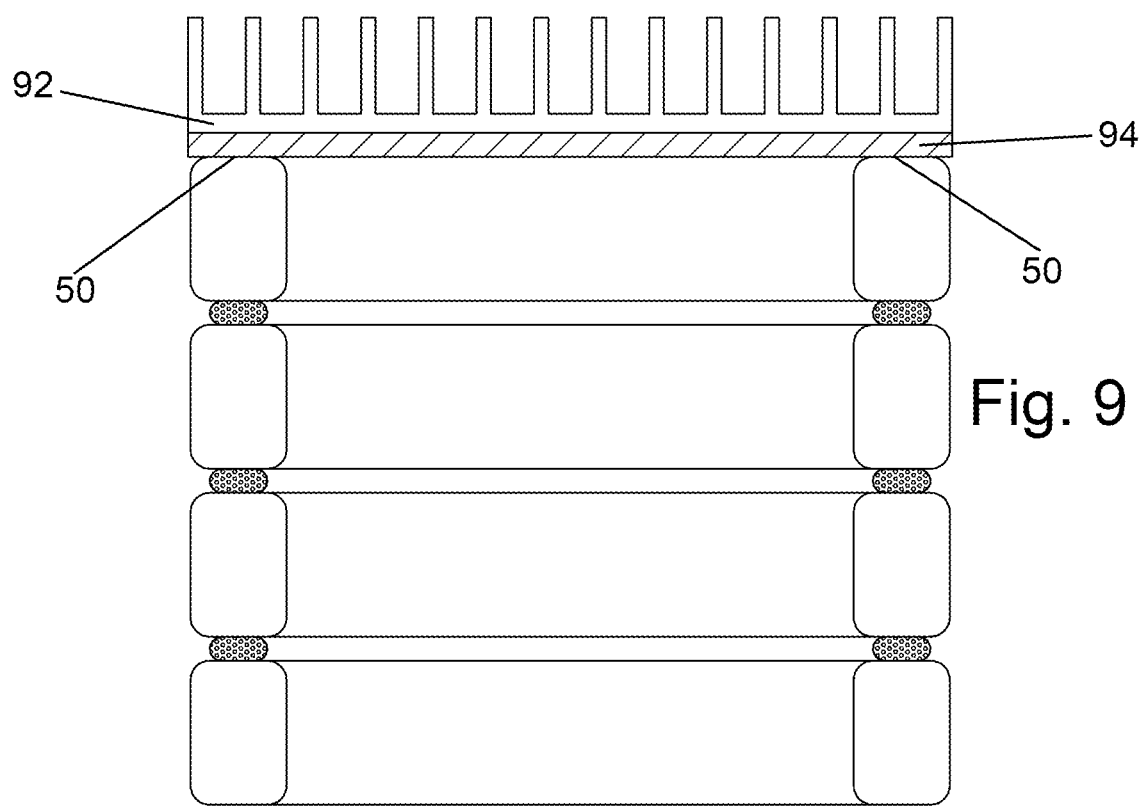
FIG. 9 is a schematic representation of a stack of capacitors and integral cooling element.
Figure 10:
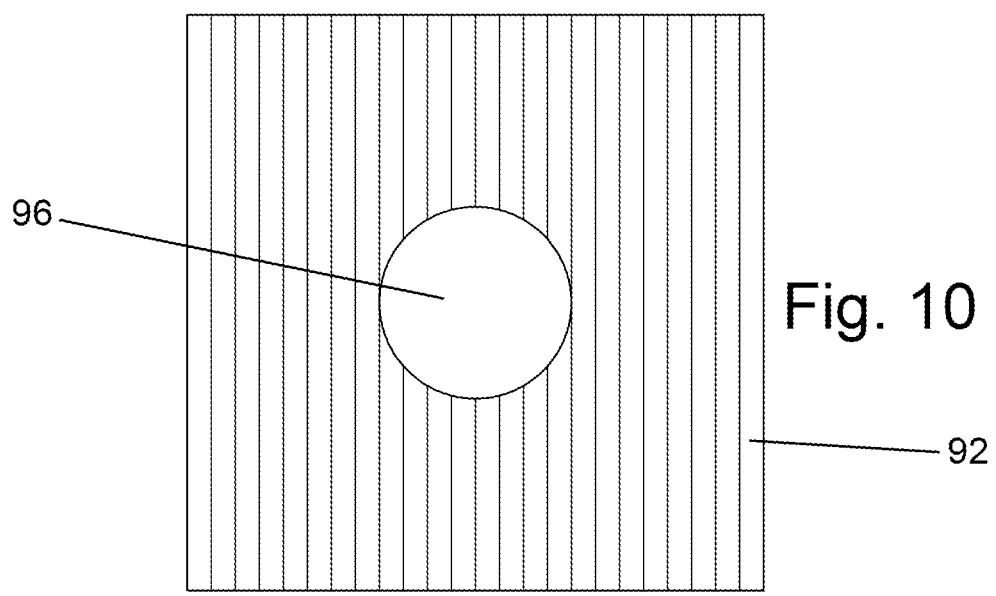
FIG. 10 is a schematic representation of a cooling element with a pick and place pad.

A particular feature of the invention is the ability to utilize cooling elements in thermal contact with the component. As illustrated in FIG. 9, a cooling element, 92, can be in thermal contact with side surfaces, 50, of the external termination of the component by a thermal interface material, 94. A further advantage is provided by a pick and place pad, 96, on the cooling element, 92, as illustrated schematically in FIG. 10, which provides convenience during manufacturing. The pick and place pad may be a flat pad feature that provides a method for pick and place of the element.

Thermal interface material (TIM) can be in the form of a solid film/pad, a paste, or a liquid material. The cooling element preferably comprises a flat faced surface to adhere to the TIM and component, and a finned faced surface to increase surface area and heat dissipation.

The cooling element/s may be over-molded in a plastic housing to simplify the assembly. The modules may be formed with the MLCC's in series or parallel with a PCB or suitable substrate material with the cooling element attached to the substrate with a TIM. The cooling element material may be of any material that provides thermal conductivity, but preferably copper, or a metal injection molded (MIM) material, or aluminum.

In applications where the modules may be exposed to vibration, a clip can be used to secure the module to the PCB where the clip has either crush ribs or barbs to secure the clip tightly in a PCB board hole and to provide stability to the MLCC module.

For the purposes of this invention electronic components are preferably selected from transistors, capacitors and preferably MLCC's, diodes, resistors, varistors, inductors, fuses, integrated circuits, overvoltage discharge devices, sensors, switches, electrostatic discharge suppressors, invertors, rectifiers and filters. Particularly preferred transistors are GaN and SiC based wide band gap devices. The components are preferably integral to functional devices such as AC/DC converters, DC/AC inverters, EMI/RFI filters, snubbers, harmonic filters and particularly AC harmonic filters.

Cooling mediums can be liquid or gas at operating conditions with the proviso that the cooling medium does not significantly alter the composition or function of the component except to the extent that temperature excursions, which can alter properties, are mitigated. Particularly preferred cooling mediums comprise materials selected from the group consisting of air; inert gas; organic materials, particularly halogenated organic materials and preferable chlorinated or fluorinated organic materials, particularly perhalogenated organics; and combinations thereof.

A thermally conductive potting material may be used to encapsulate the components in order to additionally regulate or distribute heat transfer within the module.

EXAMPLES

Leadless capacitor stacks of commercially available KEMET KONNEKT™ KC-LINK™ capacitors were mounted in different orientations and their ripple current self-heating was measured. All examples used identical stacks of 4×3640 150 nF MLCC, CKC33C604KWG, rated at 650 Vdc. A ripple current of 40 Arms (106 Vrms) at 100 kHz was applied from a nominal ambient temperature of 25° C. In each case the chip stacks were mounted to narrow FR4 PCB test strips attached above and below with SAC305 solder. The different orientations where Example A) internal electrodes were perpendicular to the PCB and side surfaces of the external termination were mounted to the PCB; Example B) an inventive vertical mount wherein the internal electrodes were perpendicular to the PCB and parallel with the long axis of the narrow PCB and the edge surfaces of the external termination was mounted to the PCB referred to as Termination Mounted Parallel; Example C) an inventive vertical mount wherein the internal electrodes were perpendicular to the PCB and perpendicular with the long axis of the narrow PCB and edge surfaces of the external termination were mounted to the PCB referred to herein as Termination Mounted perpendicular; and Example D) a comparative standard mount wherein the internal electrodes were parallel with the PCB and the side surfaces of the external termination of the top and bottom capacitor were mounted to the PCB referred to as Standard Orientation. Examples B and C were to insure no testing bias due to the use of narrow test strips.

Once mounted heat sinks were clamped to the substrates to allow heat to dissipate.

The design of the PCBs, the shape/size/cap value of the MLCC stack and the configuration of the heatsinks were maintained the same from example to example with the only difference being the shape of the pad to accommodate the mounting orientations.

Once mounted and thermally secured, the different orientations were connected with different current paths in the different examples and orientations as shown in FIG. 11 and the current path used in a particular example are indicated by the letters which was a function of the design of the circuit board.

In all examples the current was increased to 40 Arms, 106 Vrms at 100 kHz. Temperature increases from the nominal 25° C. ambient temperature were monitored via infrared camera to observe the heating of the differently mounted orientation examples and current pathways. The maximum surface temperatures of the MLCC in these different examples were noted at the steady state condition and are summarized in Table 1.

TABLE 1

Maximum Capacitor Temperature @ 40 Arms, 100 KHz.

| EXAMPLE | MOUNTING ORIENTATION | CURRENT Path | MAX Capacitor Temp @ 40 Amps |
|---|---|---|---|
| 1 | Standard | A to B | 71° C. |
| 2 | Standard | A to C | 71° C. |
| 3 | Low Loss | A to B | 42° C. |
| 4 | Low Loss | A to C | 43° C. |
| 5 | Termination - Parallel | A to C | 32° C. |
| 6 | Termination - Parallel | A to D | 34° C. |
| 7 | Termination - Perpendicular | A to C | 31° C. |
| 8 | Termination - Perpendicular | A to D | 32° C. |

The inventive examples 5 to 7 had significantly less ripple current heating of 31° C. to 34° C. compared to the comparative examples 3 and 4 which increased to 42° C. to 43° C. The comparative examples 1 and 2 had the highest ripple current with heating up to 71° C. The direction of the current applied had only a small effect on the maximum temperature reached. These series of examples clearly show that the inventive examples have significantly lower ripple current heating. This assembly approach allows more power/current to be applied to the circuit without overheating the capacitors or other components in close proximity. Integrating MLCCs in this way into modules and circuits provides an improved structure by which heating may be reduced and this can be further improved by conductive or convective cooling in these assemblies wherein heat is dissipated away from the components. It will be realized by those skilled in the art that these effects will be magnified by combining more MLCC's into a module or embedding them with the circuit board and that these results are not limited by any particular case size of MLCC.

The invention has been described with reference to the preferred embodiments without limit thereto. Additional embodiments and improvements may be realized which are not specifically set forth herein but which are within the scope of the invention as more specifically set forth in the claims appended hereto.

The invention claimed is:

1. A high-density multi-component package comprising:
a first module interconnect pad; and
a second module interconnect pad;
an array of electronic components mounted to and between said first module interconnect pad and said second module interconnect pad wherein a first electronic component of said electronic components is vertically oriented relative to said first module interconnect pad and a second electronic component of said electronic components is vertically oriented relative to said second module interconnect pad;
wherein said first electronic component and said second electronic component are first adjacent electronic components wherein said first electronic component and said second electronic component have opposite polarity; and
a positive connector tab in electrical connection with adjacent external terminations having positive polarity.

2. The high-density multi-component package of claim 1 wherein at least one said electronic component of said electronic components comprises internal electrodes wherein said internal electrodes are perpendicular to said module interconnect pad.

3. The high-density multi-component package of claim 1 wherein at least one said electronic component of said electronic components comprises external terminations with each external termination of said external terminations comprising an edge surface and side surfaces wherein one said edge surface is mounted to said first module interconnect pad.

4. The high-density multi-component package of claim 1 further comprising a wide band gap-semiconductor device wherein said first interconnect pad and said second interconnect pad are integral to said wide band gap-semiconductor device.

5. The high-density multi-component package of claim 1 wherein said first electronic component is a first multilayered ceramic capacitor and said second electronic component is a second multilayered ceramic capacitor.

6. The high-density multi-component package of claim 1 wherein said electrical components are mounted using a transient liquid phase sintering adhesive.

7. The high-density multi-component package of claim 1 further comprising component terminations wherein said component terminations contain a compliant flexible termination.

8. The high-density multi-component package of claim 1 further comprising an electrically conducting portion received in a recess of an electrically insulating portion.

9. The high-density multi-component package of claim 1 wherein at least one said electronic component is a multilayered ceramic capacitor.

10. The high-density multi-component package of claim 1 further comprising at least one cooling component.

11. The high-density multi-component package of claim 1 further comprising at least one electrically insulated restraint arranged to secure said first module interconnect pad and said second module interconnect pad in a fixed position relative to each other.

12. The high-density multi-component package of claim 6 wherein said transient liquid phase sintering adhesive comprises copper and tin.

13. The high-density multi-component package of claim 8 wherein at least one said electronic component is embed within said electrically insulating portion.

14. The high-density multi-component package of claim 9 wherein adjacent electronic components are multilayered ceramic capacitors having opposite polarity.

15. The high-density multi-component package of claim 10 wherein said cooling component is between said first module interconnect pad and said second module interconnect pad.

16. The high-density multi-component package of claim 10 wherein said cooling component is a cooling channel.

17. The high-density multi-component package of claim 10 wherein said cooling component comprises a thermal conductor.

18. A high-density multi-component package comprising:
an array of electronic components comprising a first electronic component of said electronic components and a second electronic component of said electronic components;
wherein said first electronic component and said second electronic component are adjacent and each comprises a first external termination and a second external termination wherein each said first external termination and each said second external termination comprises an edge surface and side surfaces;
wherein adjacent said electronic components are opposite polarity; and
a wide band-gap semiconductor device comprising a first interconnect pad and a second interconnect pad wherein said first interconnect pad is electrically connected to said edge surface of said first external termination and said second interconnect pad is electrically connected to said edge surface of said second electronic component.

19. The high-density multi-component package of claim 18 wherein said first interconnect pad is directly electrically connected to said edge surface of said first external termination and said second interconnect pad is directly electrically connected to said edge surface of said second electronic component.

20. The high-density multi-component package of claim 18 wherein said first electronic component comprises internal electrodes.

21. The high-density multi-component package of claim 18 further comprising a substrate between said wide band-gap semiconductor device and said first electronic component wherein said substrate comprises an electrically insulating portion and an electrically conducting portion.

22. The high-density multi-component package of claim 18 wherein said first interconnect pad is in direct electrical contact with said first external termination.

23. The high-density multi-component package of claim 18 wherein at least one of said first electronic component or said second electronic component is a multilayered ceramic capacitor.

24. The high-density multi-component package of claim 18 further comprising a substrate opposite said wide band-gap device wherein said substrate comprises a conductive portion in electrical contact with said edge of said second external termination of said first electronic component.

25. The high-density multi-component package of claim 18 wherein said wide band-gap device is selected from a SiC and a GaN based device.

26. The high-density multi-component package of claim 18 further comprising at least one cooling component.

27. The high-density multi-component package of claim 20 wherein said first internal electrodes are perpendicular to said interconnect pad.

28. The high-density multi-component package of claim 21 wherein said electrically conducting portion is a via through said electrically insulating portion.

29. The high-density multi-component package of claim 25 further comprising a silicon based semiconductor.

30. The high-density multi-component package of claim 26 wherein said cooling component is between said first interconnect pad and said second interconnect pad.

31. The high-density multi-component package of claim 26 wherein said cooling component is a cooling channel.

32. The high-density multi-component package of claim 28 wherein said via is a pre-formed via.

33. The high-density multi-component package of claim 31 wherein said cooling component comprises a thermal conductor.

34. A method for forming a high-density multi-component package comprising:
providing a wide band-gap semiconductor device comprising a first interconnect pad and a second interconnect pad;
providing a substrate;
providing an array of electronic components wherein a first set of adjacent electronic components are of opposite polarity and a second set of adjacent electronic components have a connector tab in electrical contact with adjacent external terminations of common polarity; and
mounting said electronic components between said substrate and said wide band-gap semiconductor device wherein said electronic components are vertically oriented.

35. The method for forming a high-density multi-component package of claim 34 wherein a first electronic component of said electronic components comprises internal electrodes and external terminations in electrical contact with at least one internal electrode wherein said external termination comprises an edge and side surfaces.

36. The method for forming a high-density multi-component package of claim 34 a first electronic component of said electronic components and a second electronic component of said electronic components are adjacent electronic components.

37. The method for forming a high-density multi-component package of claim 34 wherein said electrical components are mounted using a transient liquid phase sintering adhesive.

38. The method for forming a high-density multi-component package of claim 34 further comprising forming a compliant flexible termination.

39. The method for forming a high-density multi-component package of claim 34 comprising inserting a first electronic component of said electronic components in a recess of said substrate.

40. The method for forming a high-density multi-component package of claim 34 wherein at least one electronic component of said electronic components is a multilayered ceramic capacitor.

41. The method for forming a high-density multi-component package of claim 34 wherein said substrate between said wide band-gap semiconductor device and a first electronic component of said electronic components wherein said substrate comprises an electrically insulating portion and an electrically conducting portion.

42. The method for forming a high-density multi-component package of claim 34 further comprising at least one cooling component.

43. The method for forming a high-density multi-component package of claim 35 wherein said edge surface is electrically connected to said first interconnect pad.

44. The method for forming a high-density multi-component package of claim 35 wherein said internal electrodes are perpendicular to said first interconnect pad.

45. The method for forming a high-density multi-component package of claim 36 wherein said first electronic component is a first multilayered ceramic capacitor and said second electronic component is a second multilayered ceramic capacitor.

46. The method for forming a high-density multi-component package of claim 36 wherein said first electronic component and said second electronic component having opposite polarity.

47. The method for forming a high-density multi-component package of claim 37 wherein said transient liquid phase sintering adhesive comprises copper and tin.

48. The method for forming a high-density multi-component package of claim 40 wherein adjacent said electronic components are multilayered ceramic capacitors having opposite polarity.

49. The method for forming a high-density multi-component package of claim 41 wherein said first electronic component is embed within said electrically insulating portion.

50. The method for forming a high-density multi-component package of claim 41 wherein said electrically conducting portion is a via through said electrically insulating portion.

51. The method for forming a high-density multi-component package of claim 42 wherein said cooling component is between said first interconnect pad and said second interconnect pad.

52. The method for forming a high-density multi-component package of claim 42 wherein said cooling component is a cooling channel.

53. The method for forming a high-density multi-component package of claim 42 wherein said cooling component comprises a thermal conductor.

54. The method for forming a high-density multi-component package of claim 43 wherein said edge surface is directly electrically connected to said first interconnect pad.

55. The method for forming a high-density multi-component package of claim 50 wherein said via is a pre-formed via.

\* \* \* \* \*